(12) United States Patent
Lee et al.

(10) Patent No.: US 7,549,905 B2
(45) Date of Patent: Jun. 23, 2009

(54) METHOD OF ENCAPSULATING AN ORGANIC LIGHT EMITTING DEVICE

(75) Inventors: Chung J. Lee, Fremont, CA (US); Atul Kumar, Santa Clara, CA (US); Chieh Chen, Palo Alto, CA (US); George Tzeng, Oakland, CA (US)

(73) Assignee: International Display Systems, Inc., Lake Forest, CA (US)

( * ) Notice: Subject to any disclaimer, the term of this patent is extended or adjusted under 35 U.S.C. 154(b) by 872 days.

(21) Appl. No.: 11/239,988

(22) Filed: Sep. 30, 2005

(65) Prior Publication Data

US 2007/0077849 A1 Apr. 5, 2007
US 2008/0038986 A2 Feb. 14, 2008

(51) Int. Cl.
*H01J 9/00* (2006.01)
(52) U.S. Cl. .................................... 445/23
(58) Field of Classification Search .............. 445/23–25
See application file for complete search history.

(56) References Cited

U.S. PATENT DOCUMENTS

| | | |
|---|---|---|
| 5,538,758 A | 7/1996 | Beach et al. |
| 5,686,360 A | 11/1997 | Harvey, III et al. |
| 5,757,126 A | 5/1998 | Harvey, III et al. |
| 5,771,562 A | 6/1998 | Harvey, III et al. |
| 6,140,456 A | 10/2000 | Lee et al. |
| 6,198,220 B1 | 3/2001 | Jones et al. |
| 6,226,890 B1 | 5/2001 | Boroson et al. |
| 6,268,695 B1 | 7/2001 | Affinito |
| 6,495,208 B1 | 12/2002 | Desu et al. |
| 6,497,598 B2 | 12/2002 | Affinito |
| 6,522,067 B1 | 2/2003 | Graff et al. |
| 6,548,912 B1 | 4/2003 | Graff et al. |
| 6,570,325 B2 | 5/2003 | Graff et al. |
| 6,573,652 B1 | 6/2003 | Graff et al. |

(Continued)

FOREIGN PATENT DOCUMENTS

WO WO 99/21924 5/1999

(Continued)

OTHER PUBLICATIONS

Iwamoto, et al., Dept. of Chemistry, Rensselaer Polytechnic Institute, Troy, New York, "Crystallization During Polymerization of Poly-p-Xylyene. III. Crystal Structure and Molecular Orientation as a Function of Temperature", Journal of Polymer Science, vol. 13, pp. 1925-1938, Apr. 1, 1975.

(Continued)

*Primary Examiner*—Joseph L Williams
(74) *Attorney, Agent, or Firm*—Alleman Hall McCoy Russell & Tuttle LLP

(57) ABSTRACT

A method of forming an organic light emitting device on a substrate is provided, wherein the method includes forming an active device structure on the substrate, adhering a mask to the substrate, wherein the mask covers an electrical contact portion of the substrate while exposing the active device structure, forming an encapsulant layer over the active device structure and the mask, forming a separation between a portion of the encapsulant layer that covers the active device structure and a portion of the encapsulant layer that covers the mask, and removing the mask from the substrate.

26 Claims, 3 Drawing Sheets

U.S. PATENT DOCUMENTS

| | | | |
|---|---|---|---|
| 6,608,283 | B2 | 8/2003 | Liu et al. |
| 6,703,462 | B2 | 3/2004 | Lee |
| 6,740,145 | B2 | 5/2004 | Boroson et al. |
| 6,797,343 | B2 | 9/2004 | Lee |
| 6,866,901 | B2 | 3/2005 | Burrows et al. |
| 6,923,702 | B2 | 8/2005 | Graff et al. |
| 2003/0195312 | A1 | 10/2003 | Lee et al. |
| 2003/0196680 | A1 | 10/2003 | Lee et al. |
| 2003/0198579 | A1 | 10/2003 | Lee et al. |

FOREIGN PATENT DOCUMENTS

| | | |
|---|---|---|
| WO | WO 99/22043 | 5/1999 |

OTHER PUBLICATIONS

Chung J. Lee, Dept. of Chemistry, Rensselaer Polytechnic Institute, Troy, New York, "Transport Polymerizatiopn of Gaseous Intermediates and Polymer Crystals Growth", Copyright 1977-1978, pp. 79-127.

C-L Lang, et al., Rensselaer Polytechnic Institute, center for Integrated Electronics, Troy, New York, Vapor Deposition of Very Low K Polymer Films, Poly(Naphthalene), Poly(Fluorinated Naphthalene), XP-002065704, Mat. Res. Soc. Symp. Proc. vol. 381, Copyright 1995 Materials Research Society, pp. 45-50.

E. Todd Ryan, et al., Center for Materials Science and Engineering, University of Texas, Austin Texas, "Effect of Depositon and Annealing on the Thermomechanical Properties of Parylene Films" XP-001120235, Mat. Res. Soc. Symp. Proc. vol. 476, Copyright 1997, Materials Reasearch Society, pp. 225-230.

Andreas Greiner, "Poly (1,4-xylylene)s: Polymer Films by Chemical Vapour Deposition", Copyright 1997, Elsevier Science Ltd., Trip vol. 5, No. 1., pp. 12-16.

M.A. Plano, et al., "The Effect of Deposition Conditions on the Properties of Vapor-Deposited Parylene AF-4 Films", XP-001120236, Mat. Res. Soc. Symp. Proc. vol. 476, Copyright 1997, Materials Reasearch Society, pp. 213-218.

J.F. Wilson, Jr., et al., "Study of Hydrogen Annealing of Ultrahigh Molecular Weight Polyethylene Irradiated With High-Energy Protons", Journal Materials Research, vol. 14, No. 11, Copyright 1999, Materials Research Society, pp. 4431-4436.

D. Mathur, et al., "Vapor Deposition of Parylene-F Using Hydrogen as Carrier Gas", Journal Materials Research, vol. 14, No. 1, Copyright 1999, Materials Research Society, pp. 246-250.

Michael Morgen, et al., "Morphological Transition in Fluorinated and Non-Fluorinated Parylenes", XP-001120143, Journal Materials Research, vol. 565, Copyright 1999, Materials Research Society, pp. 297-302.

Jay Lewis, et al., "Thin Film Permeation Barrier Technology for Flexible Organic Light-Emitting Devices", Journal of Selected topics in Quantum Electronics, 2003, pp. 1-13.

Solid State Technology, "A Vacuum Roll-to-Roll Process for Manufacturing OLED's", Copyright 2005, PennWell Corporation, pp. 1-4.

Solid State Technology, "Integrating a Nonporous Low-K (K=2.2)Film", Copyright 2005, PennWell Corporation, pp. 1-5.

Solid State Technology, "Plain Talk on Low-K Dielectrics", Copyright 2005, PennWell Corporation, pp. 1-4.

METHOD OF ENCAPSULATING AN ORGANIC LIGHT EMITTING DEVICE

TECHNICAL FIELD

The present disclosure relates to organic light emitting device display technology.

BACKGROUND

Displays utilizing organic light-emitting devices (OLEDs) such as organic light emitting diodes have shown great promise as thinner, lighter-weight displays than current liquid crystal displays (LCDs). An OLED is a device that utilizes an organic species (either a small molecule or a polymer) to emit light under an applied electric field. OLEDs are made out of one or more layers of organic materials stacked between conducting electrodes. A flow of electric current through this stack of materials stimulates the emission of light by the organic materials.

OLED technology is considered superior to LCD technology for use in displays for various reasons. For example, an OLED is an emissive system, creating its own light rather than relying on modulating a backlight. This leads to higher contrast, truer colors, crisper motion, and potentially lower power consumption compared to LCDs. Additionally, OLED displays may be manufactured via simpler and less expensive manufacturing processes than LCD displays.

However, current OLED displays suffer from short lifetimes, which may prevent the use of the OLEDs in such devices as computer monitors and large screen displays. The OLED displays must be encapsulated to prevent degradation of the organic layers caused by exposure to moisture and oxygen. Thin films of organic polymers and inorganic materials deposited over the OLEDs have been found to lessen damage to the OLED materials caused by such oxidants as moisture and oxygen. Such encapsulation layers are generally only needed over the active (light-emitting) portions of the displays, and not over other device regions, such as areas of the substrate intended for use as electrical contacts for connecting the device to external circuitry. However, the deposition of the encapsulation layers generally results in the uniform deposition of material over the entire substrate surface. Therefore, patterning and etching steps may be required to remove the encapsulant layers from contact areas and other such portions of the substrate.

Shadow masking may be used in certain evaporation-type deposition processes to achieve selective deposition or patterned deposition of the evaporated material while avoiding lithographic and/or etching steps. However, shadow masking may not be suitable for use with the vapor-phase deposition of some organic encapsulant materials, which may diffuse into the spaces between the shadow mask and the substrate.

SUMMARY

The present disclosure provides a method of forming an organic light emitting device on a substrate, wherein the method includes forming an active device structure on the substrate, adhering a mask to the substrate, wherein the mask covers an electrical contact portion of the substrate while exposing the active device structure, forming an encapsulant layer over the active device structure and the mask, forming a separation between a portion of the encapsulant layer that covers the active device structure and a portion of the encapsulant layer that covers the mask, and removing the mask from the substrate.

DETAILED DESCRIPTION OF THE DEPICTED EMBODIMENTS

Figure 1:
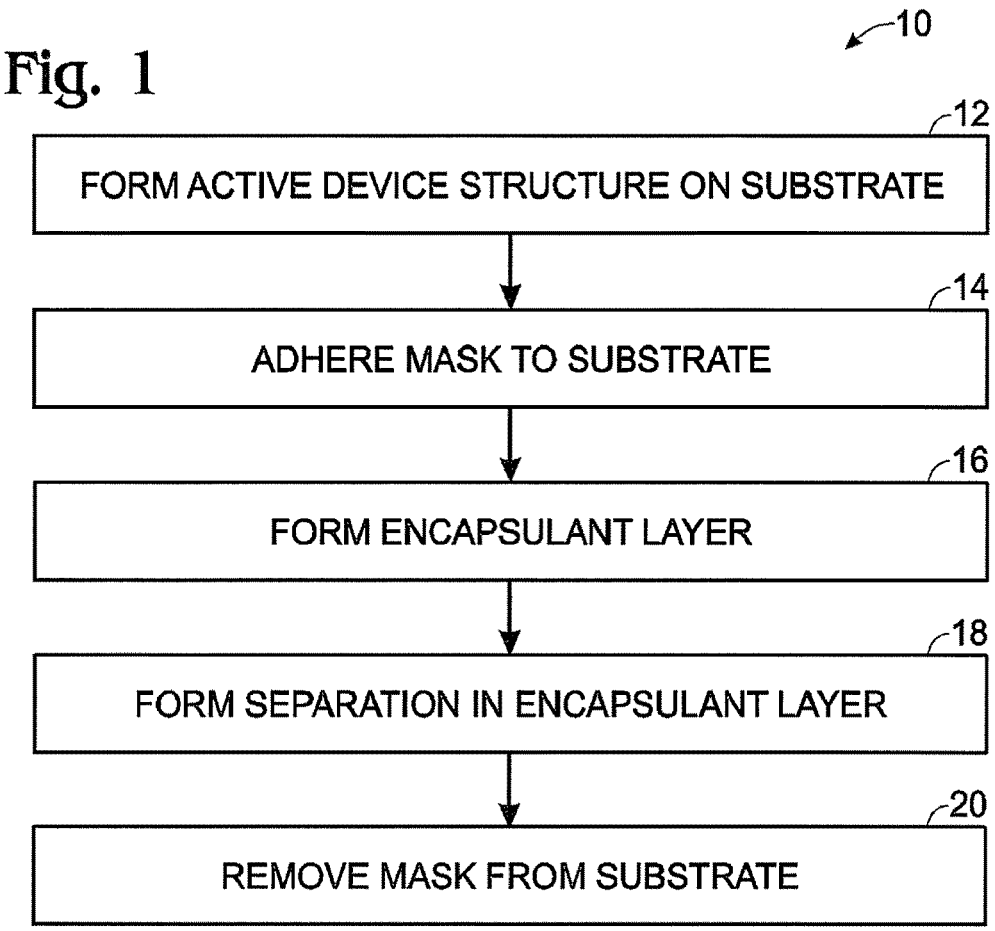
FIG. 1 shows a flow diagram of an exemplary embodiment of a method of forming an organic light emitting device.

FIG. 1 shows, generally at 10, one exemplary embodiment of a method of forming an organic light emitting device (OLED) on a substrate. Method 10 includes, at 12, forming an active device structure, for example, a thin film transistor, on the substrate. Method 10 next includes, at 14, adhering a mask to the substrate, then, at 16, depositing one or more organic light emitting layers. Next, method 10 includes, at 18, forming an encapsulant layer over the mask and the active device structure (including the organic light emitting layers). The use of an adhesive material to contact the mask to the substrate may help to prevent the encapsulant material from depositing on the substrate beneath the edges of the mask. Alternatively, in some embodiments, the mask may be contacted with, but not adhered to, the substrate, depending upon the material from which the mask is made.

After forming the encapsulant layer, method 10 includes, at 20, forming a separation in the encapsulant layer between a portion of the encapsulant layer that covers the mask and a portion of the encapsulant layer that covers the active device structure. After the separation is formed, method 10 includes, at 22, removing the mask from the substrate. These processes are described in more detail below in reference to FIGS. 2-9.

It will be appreciated that the term "substrate" as used herein denotes those surfaces to which the mask is adhered and on which the active device structure is formed, and therefore may represent any of a number of structures in the overall OLED architecture. Such structures may include, but are not limited to, glass or silicon substrates, substrates with thin film transistor (TFT) structures formed thereon, organic light-emitting layers, electrode layers, insulating layers deposited over electrode layers, and/or any other suitable device layers.

Figure 2:
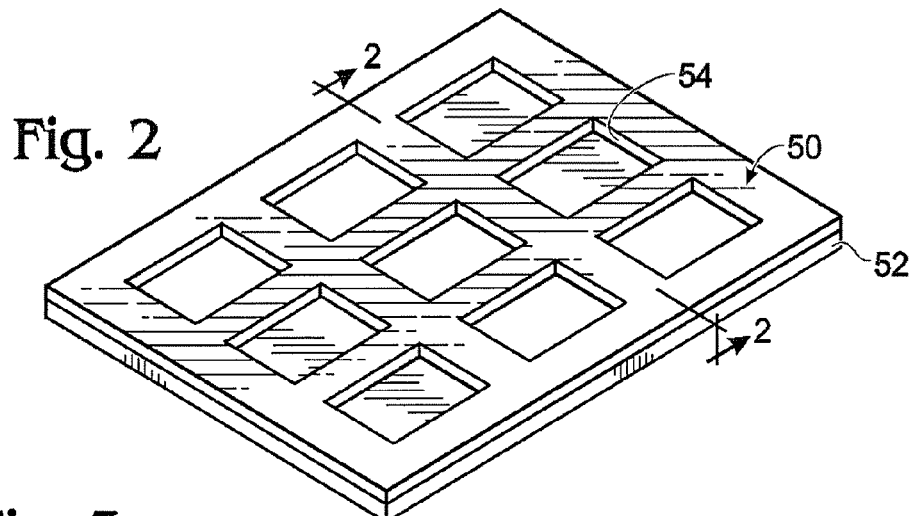
FIG. 2 shows a view of a first embodiment of a mask disposed on a substrate.

FIG. 2 shows an exemplary embodiment of a mask 50 in contact with a substrate 52. Mask 50 includes a plurality of openings 54, wherein each opening 54 is configured to expose an active device structure for the deposition of an encapsulant material. Mask 50 therefore covers portions of substrate 52 that are adjacent to and/or between the active device structures where it is desired to prevent the deposition of the encapsulant material, such as substrate areas that are intended for use as electrical contact pads, etc. Mask 50 may have any suitable number of openings 54, and the openings may have any suitable shape and size that permits the deposition of an encapsulant layer over active device structures. Likewise, mask 50 may have any suitable size relative to substrate 52. In the depicted embodiment, mask 50 has an outer perimeter the same size and shape as the outer perimeter of substrate 52. However, it will be appreciated that mask 50 may be either larger or smaller than substrate 52, and also may have a different shape than substrate 52.

In some embodiments, openings 54 are formed in mask structure 50 before mask 50 is applied to substrate 52. In these embodiments, openings 54 may be formed, for example, by a stamping, molding, laser or other cutting process, etc. In these embodiments, openings 54 may be made slightly or somewhat larger than the active device structures that openings 54 expose to make the alignment of mask 50 on substrate 52 more forgiving. In other embodiments, openings 54 are formed in mask structure 50 after mask 50 is applied to substrate 52. In these embodiments, openings 54 may be formed from a laser cutting process or other such process. Forming openings 54 after applying mask 50 to substrate 52 may offer the advantage that openings 54 do not have to be lined up with the active device structures on substrate 50 when mask 50 is applied to substrate 52.

As mentioned above, mask 50 may be adhered to substrate 52 with a suitable adhesive. The use of an adhesive between mask 50 and substrate 52 may help to prevent encapsulant material from migrating to portions of the substrate beneath mask 50. For example, it has been found that parylene-based materials may be useful as encapsulant layers for OLEDs, either alone or in combination with inorganic encapsulant films. "Parylene-based" materials include polymers having a repeating unit of ($-CZ^1Z-Ar-CZ^3Z^4-$), wherein Ar is an aromatic moiety (unsubstituted, partially substituted or fully substituted), and wherein $Z^1$, $Z^2$, $Z^3$ and $Z^4$ are similar or different. In one specific example, Ar is $C_6H_{4-x}X_x$, wherein X is a halogen, and $Z^1$, $Z^2$, $Z^3$ and $Z^4$ are the same or different and each individually is H, F or an alkyl or aromatic group. More specific examples of such parylene-based materials include "PPX-F", which has a repeat unit of ($-CF_2-C_6H_4-CF_2-$), and may be formed from various precursors, including but not limited to $BrCF_2-C_6H_4-CF_2Br$; fully fluorinated poly(paraxylylene) ("FPPX-F"), which has a repeat unit of ($-CF_2-C_6F_4-CF_2-$); and unfluorinated poly(paraxylylene) ("PPX-N"), having a repeat unit of ($-CH_2-C_6H_4-CH_2-$). It will be appreciated that these specific parylene-based materials are set forth for the purpose of example, and are not intended to be limiting in any sense.

Many parylene-based polymer films may be formed via the CVD technique of transport polymerization, as disclosed in U.S. Pat. No. 6,797,343 to Lee, which is hereby incorporated by reference. Transport polymerization involves generating a gas-phase reactive intermediate from a precursor molecule at a location remote from a substrate surface and then transporting the gas-phase reactive intermediate to the substrate surface for polymerization. For example, PPX-F may be formed from the precursor $BrCF_2-C_6H_4-CF_2Br$ by the removal of the bromine atoms, thereby forming the reactive intermediate $*CF_2-C_6H_4-CF_2*$ (wherein * denotes a free radical), at a location remote from the deposition chamber, as described in U.S. patent application Ser. No. 10/854,776 of Lee et al., filed May 25, 2004, the disclosure of which is hereby incorporated by reference. This reactive intermediate may then be transported into the deposition chamber and condensed onto a substrate surface, where polymerization takes place.

Parylene-based encapsulant layers having low water vapor and oxygen transport rates and other favorable physical properties for use as an encapsulant may be formed via transport polymerization. However, the reactive intermediates used in the transport polymerization may be able to diffuse or migrate into very small dimensions. Therefore, the use of a conventional shadow mask positioned above the substrate surface may not be effective in preventing the deposition of a parylene-based film in areas protected by the shadow mask. Furthermore, placing mask 50 in contact with, but not adhered to, substrate 52 may still allow some parylene-based material to be deposited beneath mask 50, depending upon various mask and substrate properties, including the relative smoothness and flatness of the substrate and mask surfaces, the pliability of the substrate and mask surfaces, etc.

Therefore, as mentioned above, mask 50 may include an adhesive for adhering mask 50 to substrate 52. The use of an adhesive may help to prevent the deposition of encapsulant material on the areas of the substrate beneath mask 50. Any suitable adhesive material may be used. In some embodiments, the adhesive material is a pressure sensitive adhesive. Such a material may allow mask 50 to be easily adhered to substrate 52, and also easily removed from substrate 52 after a deposition process. Suitable pressure-sensitive adhesives include materials that do not leave any residue on the surface of substrate 52 upon removal of the adhesive. Likewise, in some embodiments, an adhesive material having a low outgassing pressure and/or that is otherwise vacuum-compatible may be used to facilitate the formation of a vacuum for the transport polymerization process. Alternatively, the use of other materials for mask 50 may allow the mask to be merely contacted with, and not adhered to, substrate 52 and still prevent the deposition of encapsulant material beneath mask 50.

Figure 3:
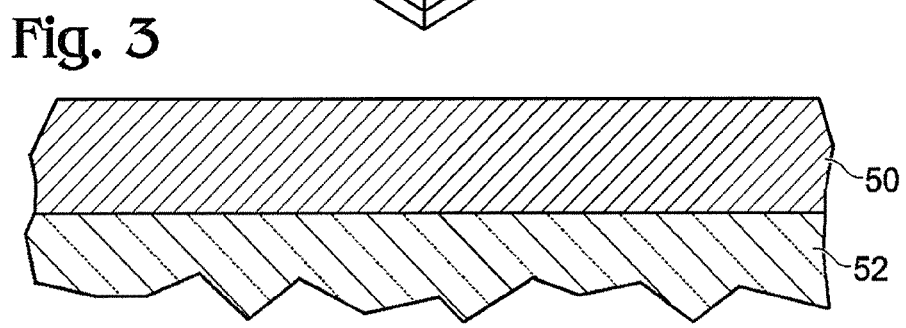
FIG. 3 shows a schematic, sectional view of the mask and substrate of FIG. 2.
Figure 4:
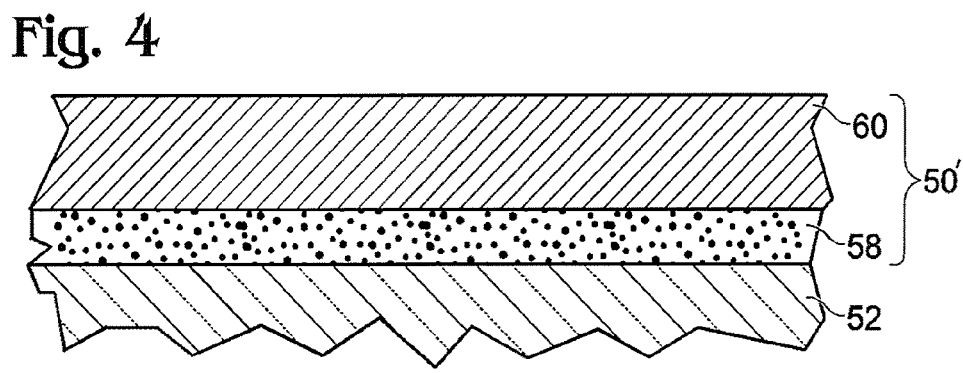
FIG. 4 shows a schematic, sectional view of an alternate embodiment of a mask mounted to a substrate.

In some embodiments, mask 50 may be formed entirely of the adhesive material. This is illustrated in FIG. 3, which shows a mask 50 formed entirely of the adhesive material adhered to substrate 52. Alternatively, as illustrated in FIG. 4, mask 50 may have a composite or multi-layer structure including an adhesive layer 58 applied to an outer mask layer 60 for bonding outer mask layer 60 to substrate 52'. Any suitable material may be used for outer mask layer 60. Suitable materials include, but are not limited to, thin plastic films (including but not limited to thin PET (polyethylene terephthalate), polyethylene and polypropylene sheets) and thin metal sheets. Outer mask layers 60 of these materials may be easily produced with large surface areas and at with relatively low cost. Materials suitable for use as mask 50' having thicknesses of few microns to several hundreds microns and pre-coated with pressure sensitive adhesive may be obtained from commercial sources such as Nitto Chemical in Japan. Alternatively, a pressure sensitive adhesive in the form of a monomer may be applied to substrate 52, and then polymerized (for example, by exposure to UV light or other suitable form of energy). However, if the adhesive is not completely polymerized, some monomer may remain on substrate 52 after removing the mask.

Mask 50 may have any suitable thickness. For example, in some embodiments, mask 50 may include a layer of adhesive material having a thickness as least as great as a maximum magnitude of substrate surface roughness. This may allow the pressure-sensitive adhesive material to fill any roughness in the substrate surface and therefore prevent the deposition of encapsulant in localized areas of surface roughness. In the specific example of a single layer mask formed from an adhesive material for use on an indium tin oxide substrate surface layer, examples of suitable thicknesses include thicknesses between approximately 50-1000 microns. For a composite mask, suitable thicknesses for outer mask layer 60 include thicknesses between 10 and 5000 microns, and suitable thicknesses for adhesive layer 58 include thicknesses between 0.1 to 100 microns. It will be appreciated that these ranges are merely exemplary, and that the various layers of mask 50 and/or 50' may have any other suitable thicknesses.

Figure 5:
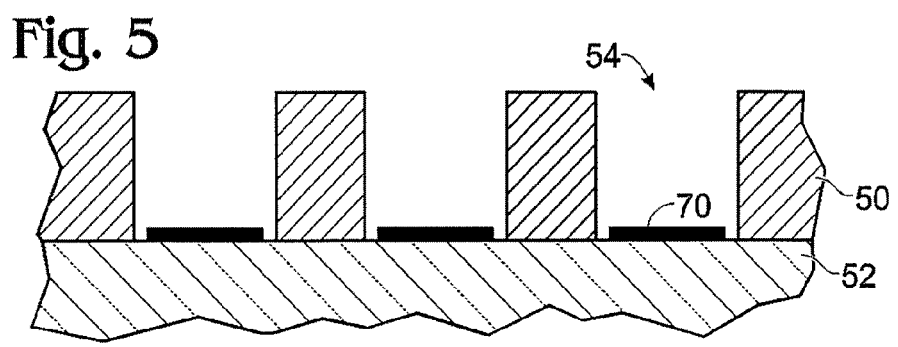
FIG. 5 shows a schematic, sectional view of an embodiment of a mask mounted to a substrate having a plurality of active OLED device structures.

FIG. 5 shows a schematic depiction of mask 50 adhered to substrate 52, and also shows a plurality of active device structures 70 disposed on substrate 52 within the openings 54 in mask 50. The relative dimensions of mask 50, substrate 52, and active device structures 70 are exaggerated in FIG. 5 for the purpose of illustration. Furthermore, although substrate 52 and active device structures 70 are each shown as single layer structures, it will be appreciated that substrate 52 and active device structures 70 may each include a plurality of layers. The edges of mask openings 55 may have any suitable spacing from the outer edges of active device structures 70. Examples of suitable spacing include, but are not limited to, spacing of 100-500 microns.

Figure 6:
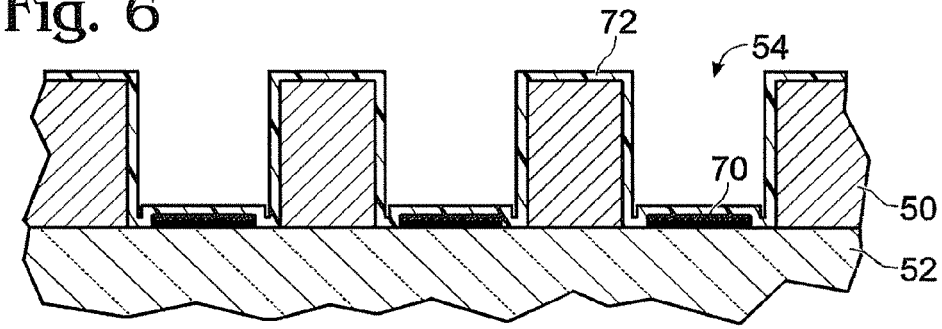
FIG. 6 shows a schematic, sectional view of the embodiment of FIG. 5 with a first encapsulant layer formed over the mask and the active OLED device structures.

Next, FIG. 6 shows mask 50, substrate 52 and active device structures 70 after the formation of organic light emitting layers (which are understood to be a part of active device structures 70) and the deposition of a polymer encapsulant layer 72. Where polymer encapsulant layer 72 is formed from a parylene-based material via transport polymerization, the film tends to form an even, continuous coating over all exposed mask, substrate and active device structure surfaces, as depicted in FIG. 6. However, mask 50 prevents the deposition of polymer encapsulant layer 72 in regions where mask 50 is in contact with substrate 52. Polymer encapsulant layer 72 may have any suitable thickness. Where the height of active device structures 70 over an upper surface of substrate 52 is approximately 5 microns, examples of suitable thicknesses include, but are not limited to, thicknesses between 0.3 to 3 microns.

As described above, mask 50 may be adhered to substrate 52 at any suitable point in a display device fabrication process. In some embodiments, mask 50 is applied to substrate 52 after the formation of TFT structures, but before the deposition of organic light emitting materials. Wherein the organic light emitting materials are deposited under a vacuum, the application of mask 50 to substrate 52 before the deposition of the organic light emitting material(s) allows the vacuum to be maintained between the deposition of the organic light emitting materials and polymer encapsulant layer 72, thereby helping to prevent damage to the organic light emitting layer (s) caused by breaking vacuum to apply mask 50 to substrate 52.

After depositing polymer encapsulant layer 72, further processing may be performed to modify the physical properties of the layer as desired. For example, in the specific example of parylene-based polymer films such as PPX-F, careful control of deposition chamber pressure, reactive intermediate feed rate and substrate surface temperature can result in the formation of a parylene-based polymer encapsulant film having a high level of initial crystallinity. If desired, the film may then be annealed to increase its crystallinity and, in some cases, to convert it to a more dimensionally and thermally stable phase. Methods for forming semi- and highly crystalline parylene-based polymer films are described in U.S. Pat. No. 6,703,462 to Lee, the disclosure of which is hereby incorporated by reference.

The conditions under which such growth occurs may depend upon variables such as the substrate temperature, the deposition system pressure, reactive intermediate feed rate, and system leak rate (system leakage can introduce free-radical scavengers, such as oxygen, water, etc. from the outside atmosphere that can terminate growth of the chains of the parylene-based polymers). In the specific example of PPX-F, examples of suitable ranges for these variables include, but are not limited to, the following: deposition chamber pressures of approximately 1 to 100 mTorr (and, in specific embodiments, approximately 5 to 25 mTorr); substrate temperatures of approximately 10 to −80 degrees Celsius; leakage rates of approximately 2 mTorr/min or less (and, in specific embodiments, as low as 0.4 mTorr/min or less); and reactive intermediate feed rates of approximately 1 to 20 sccm. It will be appreciated that these ranges are merely exemplary, and that processing conditions outside of these ranges may also be used.

The crystallinity of an as-deposited, semi-crystalline parylene-based polymer film may be improved by annealing the film after deposition. This may be advantageous in some situations, as highly crystalline polyparylene-based films may offer improved moisture and oxygen barrier characteristics. The use of an annealing process may improve the crystallinity of the semi-crystalline parylene-based polymer film from the initial 10% to as high as 70%. While annealing may improve the moisture- and oxygen-barrier properties of a parylene-based polymer film, it will be appreciated that even an as-deposited and un-annealed parylene-based polymer film formed via the methods described above may have sufficient crystallinity to be useful as an OLED encapsulant layer.

Annealing may also convert the parylene-based polymer barrier films to more thermally stable phases. Many parylene-based polymers, including but not limited to PPX-F and PPX-N, may have several different solid phases that exist at different temperatures and/or pressures. For example, the phase diagram of PPX-F includes at least an alpha phase, a beta-1 phase and a beta-2 phase. The alpha phase is a solid phase that exists at lower temperatures. When forming a PPX-F film by transport polymerization, relatively large amounts of alpha phase material may be initially formed. PPX-F undergoes an irreversible phase transition between the alpha phase and beta-1 phase when heated to a temperature of approximately 200-290° C. Therefore, an annealing step may be used to convert an as-deposited PPX-F film to a more dimensionally stable beta-1 phase. Furthermore, PPX-F undergoes a reversible beta-1 to beta-2 phase transition at a temperature of 350-400° C. It has been found that PPX-F films can be trapped in the beta-2 phase by first heating to a temperature above the beta-1 to beta-2 phase transition temperature on a hotplate or in an oven, holding the PPX-F film at 350 to 400° C. for a duration of, for example, 2 to 30 minutes, and then cooling the film at a fairly rapid rate, for example, between 30 and 50° C./sec, to a temperature below the beta-1 to beta-2 phase transition temperature. In this case, an annealing step followed by a rapid cooling step may be used to trap a film in a beta-2 phase so that, in the event that the film will have to undergo further processing steps at temperatures higher than the beta-1 to beta-2 phase transition temperature, no dimension-changing beta-1 to beta-2 phase transition will occur.

Furthermore, the annealing may be performed under a reductive atmosphere, such as hydrogen mixed with nitrogen or argon, to cap any unreacted polymer chain ends. It will be appreciated that the annealing and cooling conditions described above are merely exemplary, and that suitable annealing conditions outside of the stated ranges may also be used. Furthermore, it will be appreciated that the annealing concepts described above may be extended to other polymer films that have similar or different solid phase boundaries.

Some of the organic materials used as electron transport layers, hole transport layers, and/or light emitting layers in OLEDs may not be thermally stable at the desired annealing temperatures. For example, some commonly used OLED organic materials are unstable at temperatures as low as 60° C. To protect these layers during an annealing process, more directed annealing methods than hotplate- or oven-based annealing methods may be used. For example, in some embodiments, laser or focused IR techniques may be used to anneal the second parylene-based polymer film 38. The use of a laser or focused IR may allow energy to be delivered to the semi-crystalline parylene-based polymer layers with a relatively high degree of specificity, thereby avoiding delivering unwanted energy to the organic layers. Additionally, a reflective layer or layers, such as a Bragg reflector structure (not shown), may be used between encapsulant layer 72 and the organic device layers to provide further protection to the organic device layers. It will be noted that the parylene-based materials are deposited at low temperatures, as described above. Therefore, the deposition of parylene-based materials as polymer encapsulant layer 72 generally will not cause any thermal damage to most organic light-emitting materials used in OLEDs.

Figure 7:
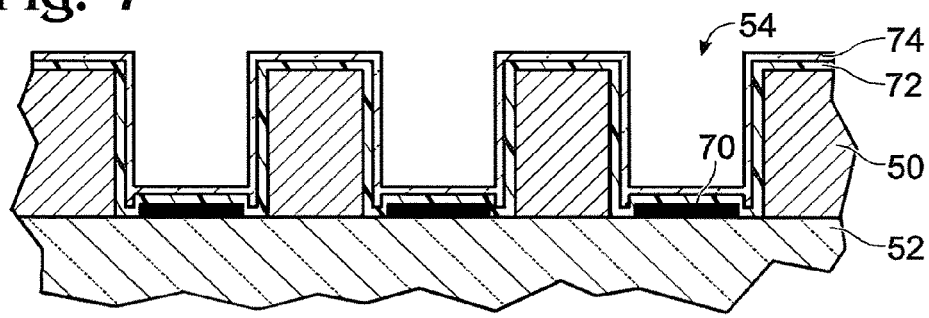
FIG. 7 shows a schematic, sectional view of the embodiment of FIG. 6 with a second encapsulant layer formed over the first encapsulant layer.

After forming polymer encapsulant layer 72, additional encapsulant layers may be deposited to help improve the lifetime of active device structures 70. For example, as depicted in FIG. 7, an inorganic encapsulant layer 74 may be formed over polymer encapsulant layer 72. The use of an inorganic encapsulant layer 74 deposited over (or beneath) polymer encapsulant layer 72 may help to provide additional protection to active device structures 70 from water vapor and oxygen. Any suitable materials may be used to form inorganic barrier layer 34. Examples of suitable materials include, but are not limited to, alumina, $SiO_xC_yH_z$, $SiO_xF_y$, $SiO_2$, $Si_xO_yN_z$, SiC, and $Si_xN_y$. Likewise, inorganic barrier layer 34 may have any suitable thickness. Suitable thicknesses include, but are not limited to, thicknesses between 500 and 5000 Angstroms.

Where polymer encapsulant layer 72 is formed from one of the above-described parylene-based polymer materials, the thermal stability of the parylene-based polymer may allow the use of chemical vapor deposition (CVD) techniques to form inorganic encapsulant layer 74. This is in contrast to polyacrylates, which are commonly used as encapsulant layers in OLEDs and which require the use of lower temperature techniques, such as sputtering, to form inorganic barrier layers. Examples of suitable CVD techniques include, but are not limited to, plasma CVD or downstream plasma CVD processes. These and other CVD techniques typically generate better quality films and allow higher throughput than sputtering techniques. However, it will be appreciated that sputtering, or any other suitable film deposition method, may be used to deposit inorganic barrier layer 74.

FIGS. 6 and 7 depict the deposition of an encapsulant structure having a single polymer encapsulant layer 72 and a single inorganic encapsulant layer 74. However, more than one polymer and/or inorganic layer may be used if a higher degree of protection is desired. For example, two inorganic layers sandwiching a polymer layer, two polymer layers sandwiching an inorganic layer, or two or more of inorganic and polymer layers, may be used.

After forming polymer encapsulant layer 72 and inorganic encapsulant layer 74, mask 50 may be removed to expose those portions of substrate 52 that were protected from the deposition of encapsulant layers 72 and 74. However, simply lifting mask 50 from substrate 52 may cause encapsulant layers 72 and 74 to peel away from substrate 52 and active device structure 70, or may cause other damage to encapsulant layers 72 and 74.

Figure 8:
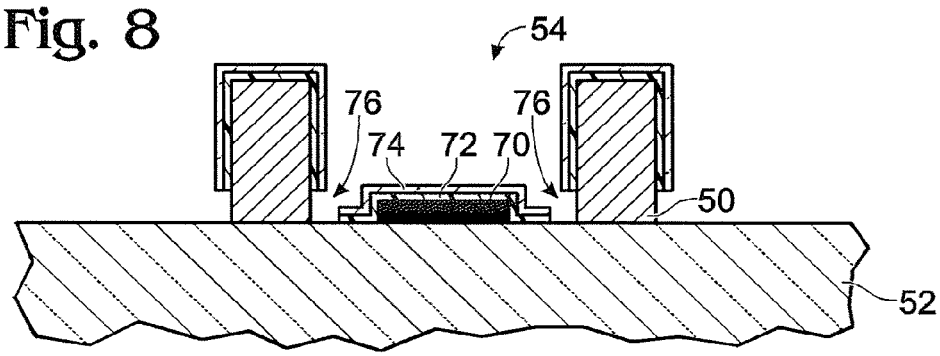
FIG. 8 shows a schematic, sectional view of a separation formed in the first and second encapsulant layers of FIG. 7 adjacent one of the active OLED device structures.
Figure 9:
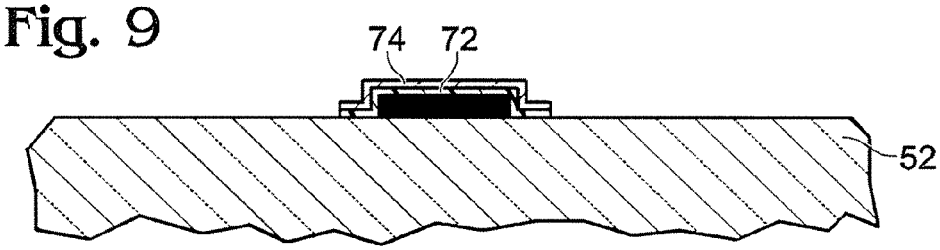
FIG. 9 shows a schematic, sectional view of the active OLED device structure of FIG. 8 with the mask removed.

To prevent such damage from occurring, those portions of encapsulant layers 72 and 74 that are disposed over active device structure 70 may be separated from those portions that are deposited over mask 50 before removing mask 50, as depicted at 76 in FIG. 8. This separation or division between the portions of encapsulant layers 72 and 74 disposed over active device structure 70 and the portions disposed over mask 50 may be formed in any suitable manner. In one embodiment, a laser is used to cut through encapsulant layers 72 and 74. The use of laser ablation may offer the advantage that the separation between the mask-covering and active device-covering portions of encapsulant layers 72 and 74 may be formed without any resist patterning and etching steps. In the depicted embodiment, this cut is formed along the inner edges of the mask openings 54. However, the cut may be formed at any other suitable location that allows mask 50 to be removed without compromising the integrity of encapsulant layers 72 and 74. After forming a separation 76 through encapsulant layers 72 and 74 for each mask opening 54, mask 50 may be easily removed from substrate 52, thereby revealing the electrical contact portions (or other active portions) of substrate 52, as shown in FIG. 9.

Although the present disclosure includes specific embodiments of encapsulant layers, masks, and methods of depositing the encapsulant layers, specific embodiments are not to be considered in a limiting sense, because numerous variations are possible. The subject matter of the present disclosure includes all novel and nonobvious combinations and subcombinations of the various films, masks, processing methods, and other elements, features, functions, and/or properties disclosed herein. The description and examples contained herein are not intended to limit the scope of the invention, but are included for illustration purposes only.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

We claim:

1. A method of forming an organic light emitting device on a substrate, comprising:
   forming an active device structure on the substrate;
   adhering a mask to the substrate, wherein the mask covers an electrical contact portion of the substrate while exposing the active device structure;
   forming an encapsulant layer over the active device structure and the mask;
   forming a separation between a portion of the encapsulant layer that covers the active device structure and a portion of the encapsulant layer that covers the mask; and
   removing the mask.

2. The method of claim 1, wherein the mask is adhered to the substrate with a pressure-sensitive adhesive material.

3. The method of claim 1, wherein the mask is formed from an adhesive material.

4. The method of claim 2, wherein the mask is formed from at least one of a metal and a polymer material on which an adhesive is disposed.

5. The method of claim 1, wherein the mask has a thickness of between approximately 50 μm and 5 mm.

6. The method of claim 1, wherein forming an encapsulant layer includes forming a parylene-based encapsulant layer via a vapor phase deposition.

7. The method of claim 6, wherein the parylene-based encapsulant layer is at least partially formed from a polymer having a repeating unit of —$CF_2C_6H_4CF_2$—.

8. The method of claim 6, further comprising forming an inorganic encapsulant layer in contact with the parylene-based encapsulant layer.

9. The method of claim 1, wherein the separation is formed via laser ablation.

10. The method of claim 9, wherein the mask includes an opening having an inner edge, and wherein the separation is formed by ablating the encapsulant layer along the inner edge of the opening of the mask.

11. A method of forming a plurality of organic light emitting devices on a substrate, comprising:
    forming a plurality of active device structures on the substrate, wherein each active device structure is spaced from adjacent active device structures;
    adhering a mask to portions of the substrate between the active device structures;
    depositing an encapsulant layer over the exposed active device structures and the mask;
    dividing portions of the encapsulant layer covering the mask from portions of the encapsulant layer covering the active device structure; and
    removing the mask.

12. The method of claim 11, wherein the mask includes a plurality of openings, each opening substantially surrounding a corresponding active device structure, wherein the openings are configured to expose the active device structures to a deposition environment while the mask is contacting the substrate.

13. The method of claim 12, wherein each opening includes an inner edge and wherein each active device structure includes an outer edge, and wherein separating includes forming a cut between the inner edge of each opening and the outer edge of the corresponding active device structure.

14. The method of claim 13, wherein the cut is formed by laser ablation.

15. The method of claim 11, wherein portions of the encapsulant layer covering the mask are separated from portions of the encapsulant layer covering the active device structures by laser ablation.

16. The method of claim 11, wherein depositing the encapsulant layer includes depositing a parylene-based encapsulant layer.

17. The method of claim 11, wherein the parylene-based encapsulant layer is at least partially formed from a polymer having a repeating unit of —$CF_2C_6H_4CF_2$—.

18. The method of claim 11, further comprising forming an inorganic encapsulant layer in contact with the parylene-based encapsulant layer.

19. A method of forming an organic light emitting device on a substrate, comprising:
    forming an active device structure on the substrate;
    contacting a mask to the substrate with an adhesive material, wherein the mask covers an electrical contact portion of the substrate;
    depositing a parylene-based encapsulant layer over the mask and the active device structure;
    forming a separation between portions of the parylene-based encapsulant layer covering the mask and portions of the parylene-based encapsulant layer covering the active device structure via laser ablation; and
    removing the mask from the substrate.

20. The method of claim 19, wherein the mask is formed from the adhesive material.

21. The method of claim 19, wherein the mask is formed at least partially from at least one of a metal and a polymer material on which the adhesive material is disposed.

22. The method of claim 19, wherein the adhesive material is a pressure-sensitive adhesive material.

23. The method of claim 19, wherein the parylene-based encapsulant layer is at least partially formed from a polymer having a repeating unit of —$CF_2C_6H_4CF_2$—.

24. The method of claim 19, further comprising forming an inorganic encapsulant layer in contact with the parylene-based encapsulant layer.

25. The method of claim 19, wherein the inorganic encapsulant layer is at least partially formed from a material selected from alumina, $SiO_xC_yH_z$, $SiO_xF_y$, $SiO_2$, $Si_xO_yN_z$, SiC, and $Si_xN_y$.

26. The method of claim 19, wherein the mask includes an opening having an inner edge, and wherein the separation is formed by ablating the encapsulant layer along the inner edge of the opening of the mask.

* * * * *